United States Patent [19]
Jones

[11] 3,944,443
[45] Mar. 16, 1976

[54] ULTRA HIGH TEMPERATURE CHEMICAL REACTIONS WITH METALS

[76] Inventor: Francis Lee Jones, 1510 N. Barcelona, Pensacola, Fla. 32501

[22] Filed: May 1, 1974

[21] Appl. No.: 465,815

[52] U.S. Cl. ............. 148/16.5; 148/16.6; 148/20.3; 148/31.5; 148/39; 219/121 P
[51] Int. Cl.² ........................ C21D 1/74; C22F 1/02
[58] Field of Search .......... 148/16.5, 16.6, 16, 20.3, 148/143, 13, 4, 31.5, 39, 152; 219/121 P

[56] References Cited
UNITED STATES PATENTS

| | | |
|---|---|---|
| 3,615,924 | 10/1971 | Swoboda et al. ................... 148/143 |
| 3,694,618 | 9/1972 | Poole et al. ..................... 219/121 P |
| 3,834,947 | 9/1974 | Swoboda et al. ........................ 148/4 |

Primary Examiner—R. Dean
Attorney, Agent, or Firm—Patrick F. Henry

[57] ABSTRACT

A method for treating metals and metal surfaces is disclosed. The method includes the use of a plasma gas generated by an induction plasma system. In one embodiment, a cutting tool, such as a saw blade or razor blade is passed into contact with the plasma to produce an extremely hard blade surface. The method includes stabilization of the plasma prior to use, and the electrical insulating of metallic parts of the treating equipment in order to prevent arcing. Very high feed speeds may be employed, up to 150 feet per minute.

9 Claims, 1 Drawing Figure

ULTRA HIGH TEMPERATURE CHEMICAL REACTIONS WITH METALS

BACKGROUND AND SUMMARY OF THE INVENTION

The present invention relates to ultra high temperature plasma gas reactions with various metal compositions to form extremely hard surfaces.

During the past twenty years, considerable work has been done in the development of systems to create plasma, the term generally used to describe a highly energized disassociated gas or mixture of gases. The two most common plasma systems are the consumable electrode system (transferred and non-transferred) and the induction system (no consumables).

Plasma generators for generating such plasma gas typically use an electric arc or an induction coil as a means of utilizing electrical energy to heat the plasma-forming or work gas. In a typical non-transferred arc unit, the work gas flows through the arc passing between the anode and cathode and emerges from the plasma generator as a highly heated gaseous stream or flame. In an induction-type plasma generator, a high frequency induction coil, such as that used in conventional induction heating of metals, surrounds an insulated cylinder of suitable construction through which the work gas is flowed.

A considerable amount of work in this area has been carried out initially with a Thermal Dynamics F-40 plasma torch containing a cathode-anode, non-transferred arc configuration. For the purposes of the present invention, however, the electric arc system was discarded in favor of an induction plasma system. This was done for the following reasons: (1) the induction plasma system does not utilize consumable electrodes and thus does not contaminate the reactive gases; (2) consumable electrodes cause power surges which make the reaction difficult to control; (3) the non-transferred arc system has a limited plasma diameter and relatively high exit velocity in the reaction area; (4) the induction system can use almost any gas to form a plasma since it does not contain reactive electrodes. The advantage of such use is seen in the fact that air may be employed, for example, a substance which would result in rapid oxidization of a tungsten or copper electrode. This feature also provides many possible gasmetal reactions; and (5) the induction system can operate at very low velocities (40 feet per second,) so that the reaction surface is not disturbed or dimensionally changed.

Accordingly, it is an object of the present invention to provide a process which will rapidly convert various metals or metal surfaces so that they possess unique chemical and physical properties.

Another object of the present invention is to provide metal surface hardnesses up to or above Rockwell hardness values of Rc 80, by reacting a plasma gas such as a nitrogen-propane mixture with a saw or razor blade coated with titanium.

Another object of the present invention is to provide excellent corrosion resistance by reactions such as the above titanium-nitrogen-propane system. By treatment in accordance with the present invention, meat saw blades, which are subject to corrosive meat juices, are provided with greatly enhanced corrosion resistance.

A further object of the present invention is to provide a process for treating specific areas of metal objects such as saw blade tooth tips, while the adjacent or substrate areas remain unaffected.

A further object of the present invention is to provide a great variety of possible surface treatments to arrive at the desired metallurgical or chemical properties.

The above and other objects are achieved by the method of the present invention, which includes passing the surface of a cutting tool, such as a saw blade or a razor blade, in contact with plasma gas generated by an induction plasma system. The method includes the insulating of the various metallic components of the treating apparatus, in order to prevent arcing which has been found to occur with induction plasma in an environment of the type described herein. The present method also includes stabilizing of the plasma prior to use in treating the cutting tool surfaces. The present invention allows the use of high speed feeding of the tools for treatment by the plasma, with speeds of up to 150 feet per minute being commonly obtained. During treatment in accordance with the present invention, the surface of the metal is subjected to heat by the plasma to a temperature of from 7,500° to 50,000°F.

BRIEF DESCRIPTION OF THE DRAWING

The present invention will be more fully understood from the following, detailed description of the preferred embodiments, taken in conjunction with the accompanying drawing, wherein.

DESCRIPTION OF THE PREFERRED EMBODIMENTS

Figure 1:
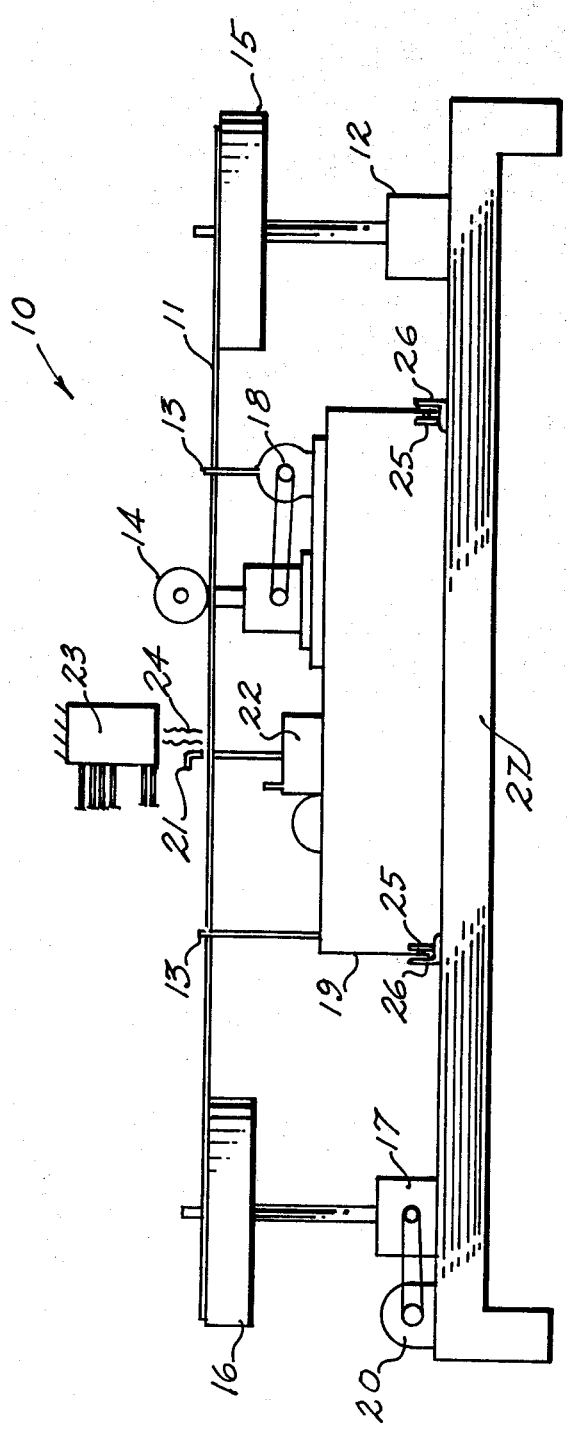
FIG. 1 is a schematic representation of apparatus employed in treating metals and metal surfaces in accordance with the present invention.

In the embodiment of the present invention as shown in FIG. 1, there is provided apparatus 10 for treating metal shapes 11 such as meat saw blades, at high speeds of about 60 to 100 feet per minute, advantageously about 77 feet per minute. When saw blades are to be treated, the blade or band 11 is generally in coils of approximately 1000 ft. when loaded on the feed reel 12. The end of the coil is attached to a length of band 11 which is threaded through plastic guide slots 13 on either side of the plasma system to position the band 11 precisely for mating with the drive gear 14.

It has been found that arcing may often occur with the use of an induction plasma system. As the plasma is highly charged, it will arc readily to metallic pieces, thus extinguishing the plasma. Therefore, in accordance with the present invention, all metallic parts of the equipment must be heavily insulated, even if not grounded. Thus, the upper cylinder 15 of the feed reel 12 is insulated with a suitable material such as styrofoam. The upper cylinder 16 of the take-up reel 17 is also insulated in a similar manner.

The drive gear 14 is connected in a conventional manner to a drive motor 18 having a variable pulley ratio to provide a variable feed speed of about 60 to 100 feet per minute for the blade 11. The drive gear 14 is insulated by means such as a Teflon spacer which connects the drive gear 14 to its drive shaft. The drive gear 14 teeth have a suitable interval between teeth so as to provide good contact with the teeth of the saw blade 11. The take-up reel 17 is provided with a variable tension drive motor 20 with slipping clutch system which maintains constant pressure on the take-up end of the coil. A recirculating quench system 21 with reservoir 22 allows the blade 11 to be cooled immediately after treatment with the induction plasma torch 23. A rust inhibitor is advantageously added to the quench liquid.

The induction plasma torch 23 may be mounted on an RF power source (not shown). The drive gear 14 and motor assembly 18, as well as the quench system 21 and guide slots 13, are mounted on a platform 19 which moves by means of rollers 25 on a track 26. The track 26 is installed on a wooden platform 27, to which platform 27, the feed 12 and take-up reels, as well as drive motor 20, are also secured. This arrangement allows the plasma 24 from the plasma torch 23 to be placed in contact with the saw band 11 by rolling the platform 19 under the plasma torch 23 only after the plasma 24 has been stabilized at the desired energy level. If the band 11 were so positioned prior to stabilization of the plasma 24, the plasma 24 could not be stabilized since the band 11 acts as an antenna and would extinguish the plasma 24, as explained above. The plasma 24 may be stabilized in accordance with general procedures for stabilizing induction plasma systems, as described, for example, in U.S. Pat. No. 3,324,334.

The plasma-forming or work gas employed in the method of the present invention is preferably a mixture of nitrogen and propane. As a mixture, these gases may be employed in a ratio of from 1–99 volume % propane to 99–1 volume % nitrogen. Also, a pure propane plasma may be employed. A preferred mixture contains 1–20 volume % propane and 99–80 volume % nitrogen. It should be pointed out that, since an induction plasma system is employed in the present invention, air may provide the source of nitrogen in the foregoing mixture, an advantage which is not available in the case where consumable electrode systems are employed, for reasons as previously discussed.

The metals which are subject to treatment in accordance with the present invention include various steel compositions, including tool steels and compositions comprising alloys of iron with from 0.02 to 1.5% carbon, as well as stainless steels, the latter containing high percentages of chromium, from less than 10 to more than 25%. Various other metals may also be employed, including cast iron, aluminum and titanium, as well as alloys of such metals.

With the plasma in a stabilized condition, the drive 18 and take-up 20 motors are started and the platform 19 is moved manually or by other suitable means along track 26 to bring the plasma 24 into contact with the saw blade 11. The plasma 24 immediately reacts with the tips of the saw band 11, hardening to a depth of up to 0.010 inches (less as the parameters of feed speed, distance from plasma exit nozzle, energy level of plasma, or type of plasma gas mixture are varied.) As the saw band 11 passes out of the plasma, it is subjected to quenching by quench system 21. Hardness values up to Rc 80 have been achieved using the above method with greatly increased saw blade life as a result.

The apparatus 10 shown in FIG. 1 provides a means of carrying out the present method with any of various metal shapes, including cutting tools such as saw blades and razor blades. Various shapes will require some differences in the feed system for feeding the particular shape through the plasma.

In the treatment of razor blades, for example, the razor blades are stacked side-by-side, up to as many as 2000 blades, and passed through the plasma gas 24 created by induction plasma torch 23. All components employed in feeding the razor blades through the plasma are insulated, in a manner similar to that described in connection with the embodiment of FIG. 1, in order to prevent arcing and subsequent extinguishing of the plasma 24. A feed speed rate of 100 to 150 ft./min. is advantageously employed, depending on blade size, the slower speeds being employed for larger blade sizes.

A bayonet or blade cannister may be employed as the blade holding means in the feed system to allow rotation of double edge blades, since the plasma gas 24 must impinge directly on the cutting edge of the blades. Hardness values similar to those obtained with the embodiment of FIG. 1 have also been obtained in treating razor blades.

In an additional embodiment, a plasma containing 10 volume % boron trifluoride and 80 volume % nitrogen was employed in reaction with a T-1 tool steel. This reaction resulted in a very thin layer, 0.001 inches in thickness, of boron nitride at the metal surface.

A titanium coating may be sputtered onto the cutting edge of the razor blades for reaction with a nitrogen-propane mixture to produce titanium carbide.

It is thought that the invention and many of its attendant advantages will be understood from the foregoing description, and it will be apparent that various changes may be made in the form, construction and arrangment of the parts without departing from the spirit and scope of the invention or sacrificing all of its material advantages, the forms hereinbefore described being merely preferred embodiments thereof.

It is claimed:

1. A method for treating metal structures to harden the surface thereof which comprises:
   a. generating a plasma gas selected from the group consisting of propane, a mixture of nitrogen and propane and a mixture of nitrogen and boron trifluoride by an induction plasma system;
   b. stabilizing the plasma gas generated by the induction plasma system;
   c. providing an electrically insulated feed system for passing the metal structure through the plasma gas;
   d. passing the metal structure consisting essentially of a metal selected from the group consisting of steel compositions, cast iron, aluminum, titanium and alloys of said metals through the plasma gas at a speed of from 60 to 150 feet per minute; and
   e. quenching the surface of the metal structure with a fluid immediately after the metal structure has passed through the plasma gas to harden the surface thereof.

2. The method of claim 1 wherein the surface of the metal is hardened by said treatment to a value of up to Rc 80 and to a depth of up to 0.010 inches.

3. The method of claim 1 wherein the plasma gas comprises a mixture of propane and nitrogen.

4. The method of claim 2 wherein the metal structure is a saw blade and wherein the saw blade is passed through the plasma at a speed of from 60 to 100 ft./min.

5. The method of claim 2 wherein the metal structure is a razor blade and wherein the razor blade is passed through the plasma at a speed of from 100 to 150 ft./min.

6. The method of claim 1 wherein the step of passing the metal structure through the plasma gas includes mounting the induction plasma system, a quench system and drive means for the feed system on a platform which is mounted for movement relative to the metal structure.

7. The method of claim 1 wherein the plasma gas contains 10 volume % boron trifluoride and 80 volume % nitrogen, and wherein said plasma reacts with a tool steel structure to provide a layer of boron nitride, 0.001 inches in thickness, at the surface of said steel structure.

8. A hardened metal structure obtained by the method of claim 2.

9. The method of claim 3 wherein a titanium coating is sputtered onto the surface of the metal stucture for reaction with said mixture of propane and nitrogen to produce titanium carbide.

* * * * *